(12) United States Patent
Yang

(10) Patent No.: US 7,818,590 B2
(45) Date of Patent: Oct. 19, 2010

(54) APPARATUS AND METHOD FOR CONTROLLING SUPPLY VOLTAGE USING HIERARCHICAL PERFORMANCE MONITORS

(75) Inventor: Se-Hyun Yang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1065 days.

(21) Appl. No.: 11/513,083

(22) Filed: Aug. 30, 2006

(65) Prior Publication Data

US 2007/0139097 A1   Jun. 21, 2007

(30) Foreign Application Priority Data

Dec. 21, 2005   (KR) .................. 10-2005-0126751

(51) Int. Cl.
*G06F 1/26* (2006.01)
*G11C 5/14* (2006.01)

(52) U.S. Cl. .................. 713/300; 713/310; 713/320; 713/322; 713/340; 713/500; 713/600

(58) Field of Classification Search .................. 713/300, 713/310, 320, 322, 340, 500, 600
See application file for complete search history.

(56) References Cited

U.S. PATENT DOCUMENTS

| 4,752,699 A | 6/1988 | Cranford, Jr. et al. |
| 5,448,155 A | 9/1995 | Jutras |

(Continued)

FOREIGN PATENT DOCUMENTS

KR   1020000009868   2/2000

(Continued)

OTHER PUBLICATIONS

Preliminary Notice of First Office Action dated Oct. 30, 2009 from the Taiwan Intellectual Property Office in corresponding Taiwan Patent Application No. 095132694.

(Continued)

*Primary Examiner*—Thomas Lee
*Assistant Examiner*—Fahmida Rahman
(74) *Attorney, Agent, or Firm*—F. Chau & Associates, LLC

(57) ABSTRACT

An apparatus and method for controlling a supply voltage using hierarchical performance monitors includes a signal generator generating an operating frequency and a target operating frequency, a supply voltage generator generating the supply voltage, a plurality of local performance monitors, and a global performance monitor. Each of the plurality of local performance monitors implemented in each different domain is modelled on a relationship between a level of the supplied voltage supplied to each different domain of a predetermined system and an operating speed or the operating frequency of a predetermined circuit implemented in the interior of the domain. The plurality of local performance monitors, respectively, monitors continuously whether the level of the supply voltage supplied to the domain is suitable for the target operating frequency, and outputs a local feedback signal. The global performance monitor generates the global feedback signal based on the local feedback signals of the plurality of local performance monitors, the supply voltage generator adjusts the level of the supply voltage based on the global feedback signal, and the signal generator changes the operating frequency to the target operating frequency when the level of the supply voltage corresponds to the target operating frequency.

13 Claims, 6 Drawing Sheets

U.S. PATENT DOCUMENTS

| | | |
|---|---|---|
| 2002/0073255 A1 | 6/2002 | Davidson et al. |
| 2005/0004718 A1* | 1/2005 | Issa et al. .................... 700/304 |
| 2006/0123368 A1* | 6/2006 | Pineda De Gyvez et al. .... 716/6 |
| 2006/0156042 A1* | 7/2006 | Desai et al. ................. 713/300 |

FOREIGN PATENT DOCUMENTS

| | | |
|---|---|---|
| TW | 200304593 | 10/2003 |
| TW | 235294 | 7/2005 |
| TW | 238302 | 8/2005 |

OTHER PUBLICATIONS

Preliminary Notice of First Office Action dated Jul. 20, 2010 in corresponding Taiwanese Appln. No. 095132694.

* cited by examiner

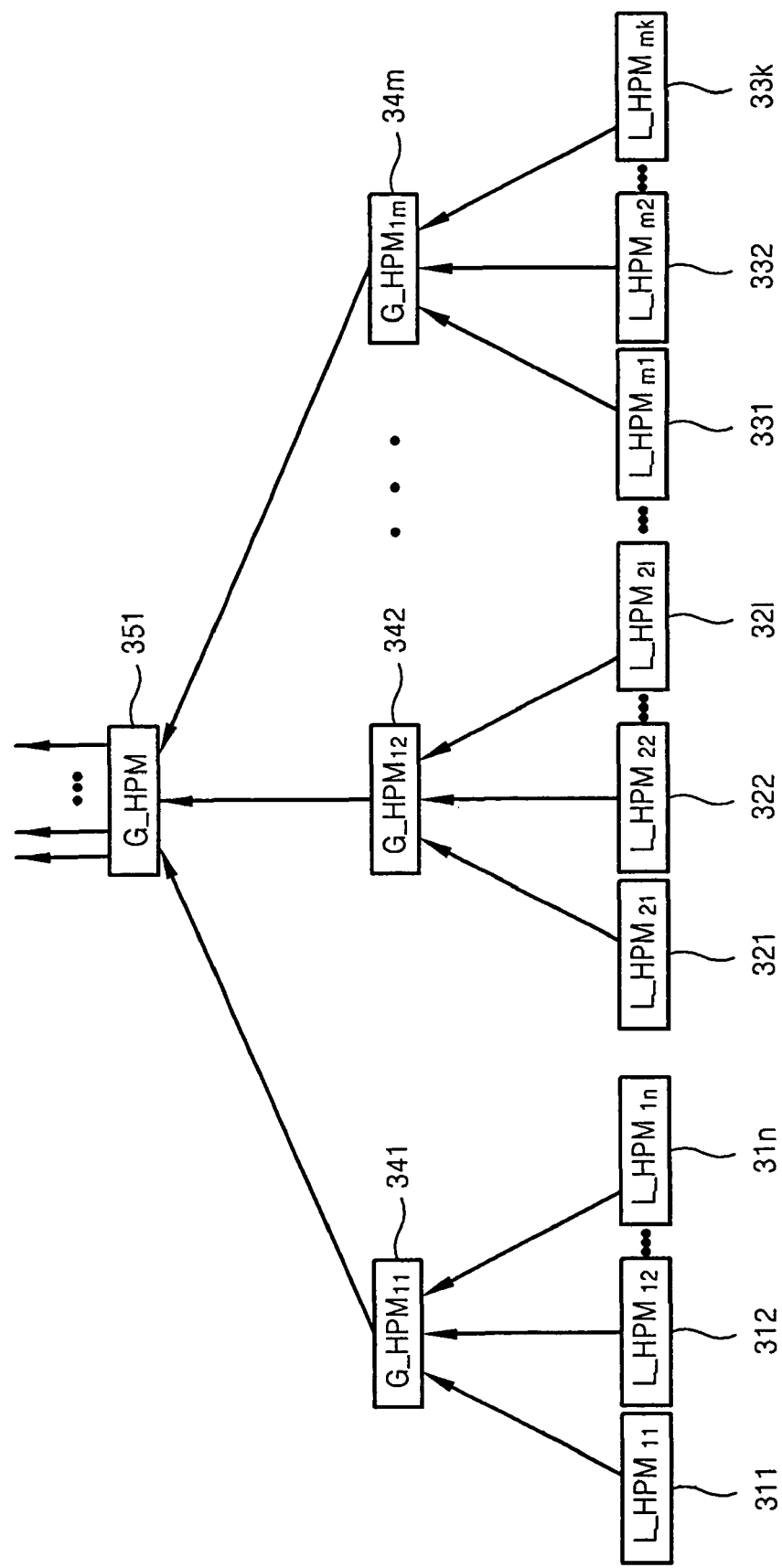

APPARATUS AND METHOD FOR CONTROLLING SUPPLY VOLTAGE USING HIERARCHICAL PERFORMANCE MONITORS

PRIORITY STATEMENT

This non-provisional application claims priority under 35 U.S.C. §119 to Korean Patent Application No. 10-2005-0126751 filed on Dec. 21, 2005 in the Korean Intellectual Property Office (KIOP), the entire contents of which are incorporated herein by reference.

BACKGROUND OF THE INVENTION

1. Technical Field

The present disclosure relates to an apparatus and method for controlling a supply voltage using hierarchical performance monitors and, more particularly, to the apparatus and method for controlling the supply voltage using hierarchical performance monitors that monitor continuously whether a level of the supply voltage supplied to a system is suitable for a target operating frequency by using the hierarchical performance monitors, and capable of controlling the level of the supply voltage based on a monitoring result.

2. Discussion of the Related Art

A hardware performance monitor (hereinafter referred to as 'HPM') is modeled on a relationship between a supply voltage supplied to a circuit or a system and an operating speed of the circuit or the system, i.e. a target operating frequency, which is changed by the supply voltage. It is one of the key factors that may be applied to a variable supply voltage scheme such as a dynamic voltage scaling or a dynamically adjustable supply voltage, etc.

In a system using the variable supply voltage scheme, the HPM monitors continuously whether the level of the supply voltage supplied to the system is suitable for the target operating frequency that is supplied, or will be supplied, to the system, and controlling the level of the supply voltage according to the monitoring result.

Success or failure of the variable supply voltage scheme depends on finding the level of the supply voltage suitable for the target generating frequency of the system based on an exact monitoring result of the HPM, and which supply voltage level may minimize the energy consumption or the power consumption of the system.

However, in a design of a semiconductor chip, the inside of each domain of a chip may have slightly different characteristics of a supply voltage-target operating speed according to the tendency of an increase of the chip's size and complexity, a variety of the chip functions, and a CMOS technology scaling.

Also, the inside of each domain of the chip has a slightly different characteristic of the supply voltage-target operating speed due to an inequality in the manufacturing process. Each of the domains operates in as many different temperatures as there are differences in activity and/or a leakage current between each domain of the semiconductor chip or the systems that occur when the system including the semiconductor chip operates. Therefore, each domain of the system, including the inner part of the semiconductor chip, or each semiconductor chip has slightly different features of the supply voltage-target generating speed.

SUMMARY OF THE INVENTION

Exemplary embodiments of the present invention provide a structure that monitors exactly whether a level of the supply voltage supplied to the system, regardless of an inequal characteristic of the inner part of the semiconductor chip, is suitable for a target operating frequency, and an apparatus and method for controlling a supply voltage, which controls the level of the supply voltage based on the monitoring result.

According to an embodiment of the present invention, an apparatus for controlling a supply voltage using hierarchical performance monitors includes a signal generator generating an operating frequency and a target operating frequency, a supply voltage generator generating the supply voltage, a plurality of local performance monitors, and a global performance monitor. The plurality of local performance monitors implemented in each different domain are, respectively, modeled on a relationship between the level of the supply voltage supplied to each different domain of a predetermined system and an operating speed (or an operating frequency) of a predetermined circuit implemented in the domain, which is changed by the voltage level. The plurality of local performance monitors, respectively, monitor continuously whether the level of the supply voltage supplied to the domain is suitable for the target operating frequency, and generate a local feedback signal. The global performance monitor generates a global feedback signal based on the local feedback signals of the plurality of local performance monitors, and the supply voltage generator controls the level of the supply voltage based on the global feedback signal. The signal generator changes the operating frequency to the target operating frequency when the level of the supply voltage corresponds to the target operating frequency.

According to an embodiment of the present invention, an apparatus for controlling a supply voltage using hierarchical performance monitors includes a supply voltage generator generating the supply voltage having an adjustable level, a signal generator generating a first signal having a first frequency and a second signal having a second frequency, a plurality of local performance monitors receiving, respectively, the second signal having the second frequency and the supply voltage output from the supply voltage generator, monitoring whether the level of the supply voltage corresponds to the second frequency based on a functional relationship between the second frequency and the supply voltage, and generating the local feedback signal according to the monitoring result, and the global performance monitor receiving the second signal having the second frequency, the supply voltage output from the supply voltage generator, and the local feedback signals output from the plurality of the local performance monitors, respectively, monitoring whether the supply voltage corresponds to the second frequency based on those received signals, and generating the global feedback signal according to the monitoring result.

The supply voltage generator controls the supply voltage based on the second signal having the second frequency and the global feedback signal, and generates an indicating signal based on the controlled level of the supply voltage. The signal generator generates the first signal having one of the first frequency and the second frequency based on the indicating signal output from the supply voltage generator.

According to an embodiment of the present invention, an apparatus for controlling a supply voltage using hierarchical performance monitors includes a supply voltage generator generating a plurality of supply voltages each having a different voltage level, respectively, a signal generator generating a plurality of target signals each having a different target frequency, respectively, a plurality of local performance monitors, and a global performance monitor.

The plurality of local performance monitors, respectively, receives a corresponding target signal among the plurality of target signals and a corresponding supply voltage among the plurality of supply voltages, monitors whether the level of the received supply voltage corresponds to the target frequency of the received target signal based on the functional relationship between the target frequency of the received target signal and the received supply voltage, and outputs a local feedback signal according to the monitoring result.

The global performance monitor receives a corresponding target signal among the plurality of target signals, a corresponding supply voltage among the plurality of supply voltages, and the local feedback signals output from the plurality of the local performance monitors, respectively, monitors whether levels of the supply voltages of the plurality of the local performance monitors, respectively, and the level of the supply voltage supplied to the global performance monitor corresponds to the target frequencies of the target signals supplied to the plurality of the local performance monitors, respectively, and target frequency of the target signal supplied to the global performance monitor based on the received signals, and generates a plurality of global feedback signals according to the monitoring result.

The supply voltage generator receives the plurality of target signals and the plurality of global feedback signals output from the global performance monitor, adjusts each level of the plurality of supply voltages based on the received signals, and outputs the plurality of level-controlled supply voltages, respectively.

The functional relationship is defined as follows: the level of the supply voltage increases when the target frequency of the target signal increases or the level of the supply voltage decreases when the target frequency of the target signal increases.

BRIEF DESCRIPTION OF THE DRAWINGS

Exemplary embodiments of the present invention can be understood in more detail from the following descriptions taken in conjunction with the attached drawings in which:

FIG. 6 is an arrangement plan for explaining a method for arranging the hierarchical performance monitors according to an embodiment of the present invention.

DETAILED DESCRIPTION OF THE INVENTION

Figure 1:
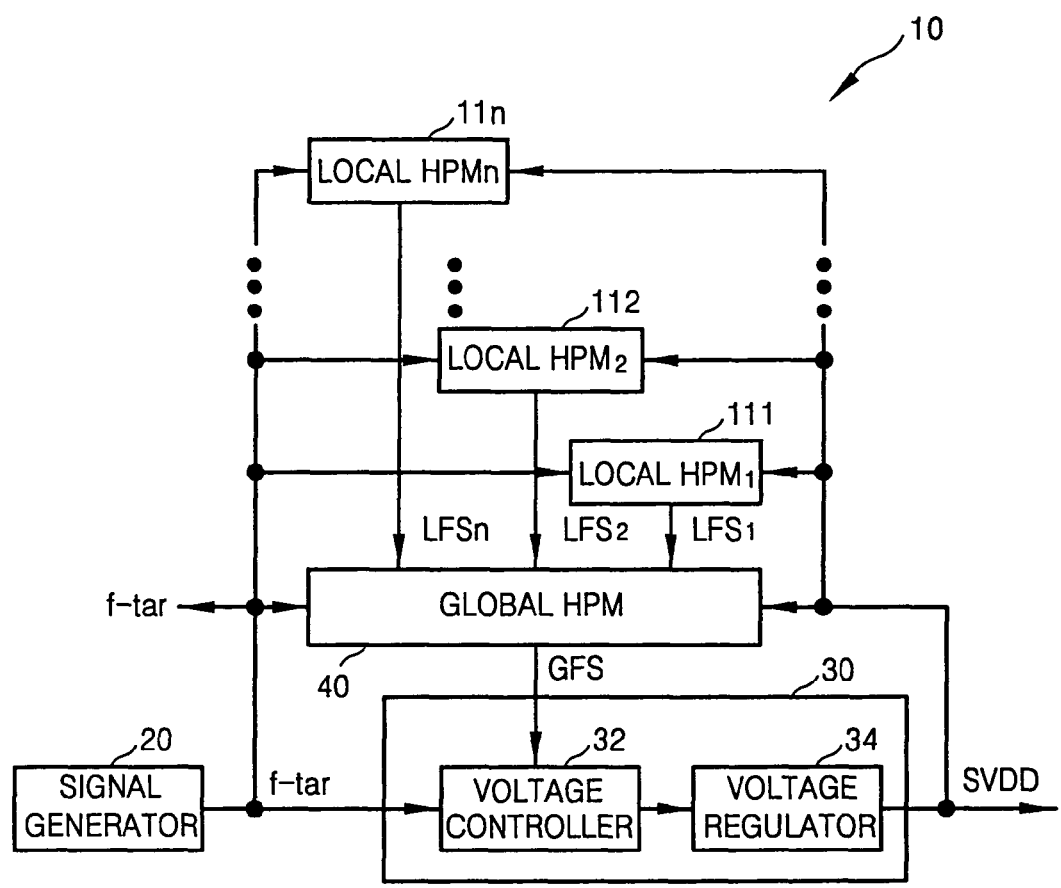
FIG. 1 is a block diagram of an apparatus for controlling a supply voltage using hierarchical performance monitors according to an embodiment of the present invention.
Figure 3:
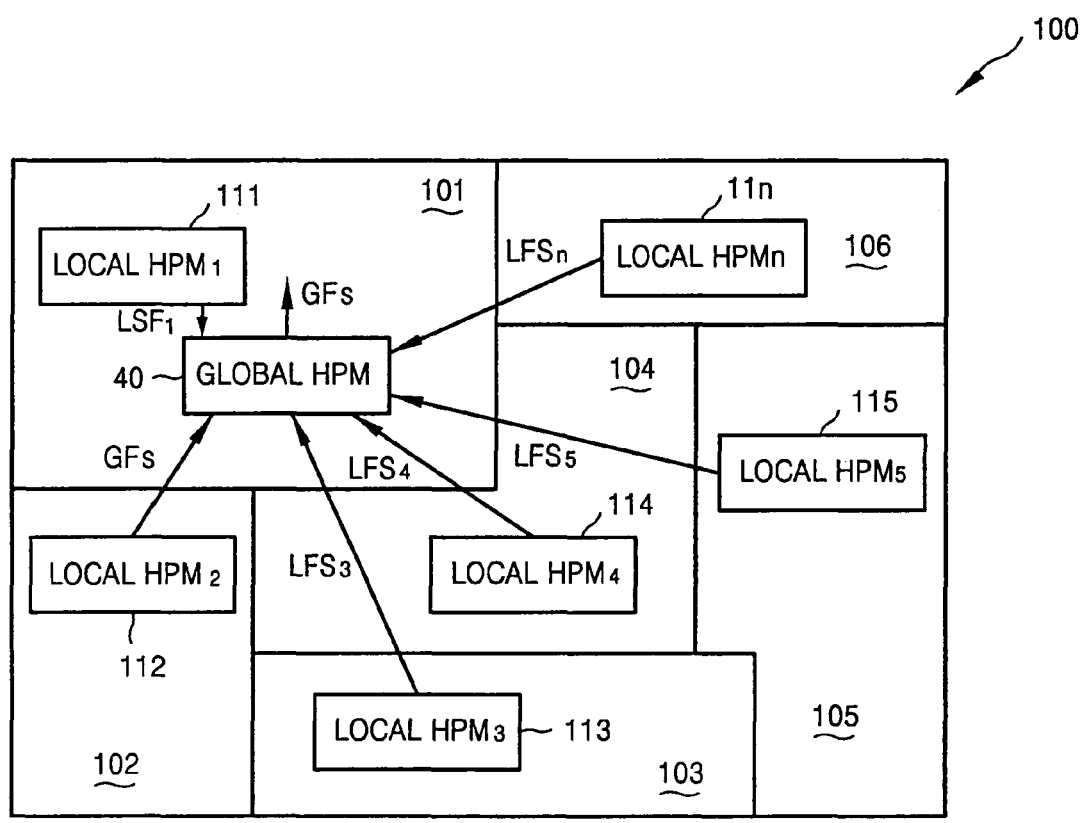
FIG. 3 is an example of a method for arranging the hierarchical performance monitors illustrated in FIG. 1 or 2.

FIG. 1 is a block diagram of an apparatus for controlling a supply voltage using hierarchical performance monitors according to an embodiment of the present invention, FIG. 3 is an example of a method for arranging the hierarchical performance monitors illustrated in FIG. 1.

Referring to FIGS. 1 and 3, the apparatus 10 or 100, for controlling the supply voltage includes a signal generator 20, a supply voltage generator 30, a global HPM 40, and a plurality of local HPMs 111 to 11n, where n is a natural number.

The apparatus 10 for controlling the supply voltage comprising the hierarchical performance monitors 40 and 111 to 11n may be implemented as a system on chip (SOC).

The signal generator 20 generates a target signal having a target frequency f-tar. Here, the target signal having the target frequency f-tar is supplied to the global HPM 40, each of the local HPMs 111 to 11n, and other apparatuses (not shown) implemented in each domain from 101 to 106, respectively.

The supply voltage generator 30 generates a supply voltage SVDD having a predetermined level. The supply voltage SVDD is supplied to the global HPM 40, each of the local HPMs 111 to 11n, and the other apparatuses (not shown) implemented in each of the domains from 101 to 106, respectively.

Each of the plurality of local HPMs 111 to 11n receives the target signal having the target frequency f-tar and the supply voltage SVDD output from the supply voltage generator 30, monitor continuously whether a level of the supply voltage SVDD corresponds to the target frequency f-tar based on a predetermined functional relationship between the target frequency f-tar and the supply voltage SVDD, and generates corresponding local feedback signals LFS1 to LFSn, respectively, according to the monitoring result.

Here, it is preferable to have the predetermined functional relationship be one in which the level of the supply voltage SVDD increases as the target frequency f-tar increases, or the level of the supply voltage SVDD decreases as the target frequency f-tar increases. But the present invention is not restricted thereto.

Also, the local feedback signals LFS1 to LFSn may each have a different level as a signal indicating one for increasing, maintaining, or decreasing the level of the supply voltage SVDD, but the present invention is not restricted thereto.

For example, the local feedback signal indicating an increase in the level of the supply voltage SVDD may be valued at '1', the value of the local feedback signal indicating a maintenance of the level of the supply voltage SVDD may be valued at '0', and the value of the local feedback signal indicating a decrease of the level of the supply voltage SVDD may be valued at '−1'.

That is, the first local HPM1 111 implemented in the first domain 101 monitors continuously whether, a level of the supply voltage SVDD supplied to the first domain 101 corresponds to the target frequency f-tar, and outputs a first local feedback signal LFS1 to the global HPM 40 according to the monitoring result.

The second local HPM2 112 implemented in the second domain 102 monitors continuously whether a level of the supply voltage SVDD supplied to the second domain 102 corresponds to the target frequency f-tar, and outputs a second local feedback signal LFS2 to the global HPM 40 according to the monitoring result.

The third local HPM3 113 implemented in the third domain 103 monitors continuously whether the level of the supply voltage SVDD supplied to the third domain 103 corresponds to the target frequency f-tar, and outputs a third local feedback signal LFS3 to the global HPM 40 according to the monitoring result.

The fourth local HPM4 114 implemented in the fourth domain 104 or a fifth local HPM5 115 implemented in a fifth domain 105 monitors continuously whether the level of the supply voltage SVDD supplied to the fourth domain 104 or the fifth domain 105 corresponds to the target frequency f-tar, and outputs a fourth local feedback signal LFS4 or a fifth local feedback signal LFS5 to the global HPM 40 according to the monitoring result.

The n$^{th}$ local HPMn 11n implemented in the n$^{th}$ domain 106 monitors continuously whether the level of the supply voltage SVDD supplied to the n$^{th}$ domain 106 corresponds to the target frequency f-tar, and outputs a n$^{th}$ local feedback signal LFSn to the global HPM 40 according to the monitoring result.

The global HPM 40 implemented in the first domain 101 receives the target signal having the target frequency f-tar, the supply voltage SVDD output from the supply voltage generator 30, and the local feedback signals LFS1 to LFSn output from the plurality of the local monitors 111 to 11n respectively, monitors continuously whether the level of the supply voltage SVDD corresponds to the target frequency f-tar based on those signals received, and generates a global feedback signal GFS according to the monitoring result.

For example, the global HPM 40 may use an arithmetical average value or a maximum value, etc of the local feedback signals LFS1 to LFSn output from the plurality of the local monitors 111 to 11n respectively, but the present invention is not restricted thereto.

The supply voltage generator 30 controls the level of the supply voltage SVDD based on the target signal having the target frequency f-tar and the global feedback signal GFS, and outputs the level-controlled supply voltage SVDD to the global HPM 40 and each of the local HPM from 111 to 11n.

The supply voltage generator 30 includes a voltage controller 32 and a voltage regulator 34. The voltage controller 32 receives the target signal having the target frequency f-tar and the global feedback signal GFS output from the global HPM 40, controls the level of the supply voltage SVDD based on those signals received, and outputs the level-controlled supply voltage SVDD. The voltage regulator 34 generates a regulated supply voltage based on the level of the supply voltage SVDD output from the voltage controller 32.

Referring to FIGS. 1 and 3, a method for controlling the supply voltage of the present invention may be explained in detail as follows. First of all, it may be supposed that the level of the supply voltage SVDD is appropriate to be 1.0V when the target frequency f-tar is 100 MHz, and the level of the supply voltage SVDD is appropriate to be 1.8V when the target frequency f-tar is 200 MHz based on the functional relationship between the target frequency f-tar and the supply voltage SVDD.

That is, when the target frequency f-tar is 100 MHz, the supply voltage generator 30 may supply the supply voltage SVDD of 1.0V level to the global HPM 40 and the plurality of the local HPMs 111 to 11n respectively.

However, when the target frequency f-tar increases from 100 MHz to 200 MHz, the level (for example 1.0V) of the supply voltage SVDD supplied to the global HPM 40 and each of the plurality of the local HPMs 111 to 11n is not suitable for the target frequency of 200 MHz. Therefore, the level (for example 1.0V) of the supply voltage SVDD output from the supply voltage generator 30 should be increased to be suitable for the target frequency of 200 MHz.

The plurality of the local HPMs 111 to 11n receive the target signal having the target frequency f-tar of 200 MHz and the supply voltage SVDD having a level of 1.0V output from the supply voltage generator 30 and generate the local feedback signals LFS1 to LFSn indicating an increase of the level of the supply voltage SVDD based on the functional relationship between the target frequency f-tar and the supply voltage SVDD, respectively.

The global HPM 40 receives the target signal having the target frequency f-tar of 200 MHz, the level, e.g. 1.0V, of the supply voltage SVDD output from the supply voltage generator 30, and the local feedback signals LFS1 to LFSn output from the plurality of the local monitors 111 to 11n respectively, monitors whether the level of the supply voltage SVDD corresponds to the target frequency f-tar of 200 MHz based on those received signals, and generates the corresponding global feedback signal GFS according to the monitoring result.

When one of the local feedback signals from LFS1 to LFSn is a signal indicating an increase in the level of the supply voltage SVDD, the global HPM 40 outputs the global feedback signal GFS indicating an increase of the level of the supply voltage SVDD to the supply voltage generator 30. Therefore, the supply voltage generator 30 increases the level of the supply voltage SVDD (for example, 1.0V) to a predetermined level (for example, 1.2V) in response to the global feedback signal GFS.

The plurality of local HPMs 111 to 11n, respectively, receives continuously the target signal having the target frequency f-tar of 200 MHz and the supply voltage SVDD having a level of 1.2V output from the supply voltage generator 30, and generates the local feedback signals LFS1 to LFSn indicating an increase of the level of the supply voltage SVDD based on the functional relationship between the target frequency f-tar and the supply voltage SVDD.

The global HPM 40, in response to the target signal having the target frequency f-tar of 200 Mhz, the level (e.g. 1.2V) of the supply voltage SVDD output from the supply voltage generator 30, and each local feedback signal LFS1 to LFSn indicating an increase of the level of the supply voltage SVDD, outputs the global feedback signal GFS indicating an increase in the level of the supply voltage SVDD to the supply voltage generator 30. Therefore, the supply voltage generator 30 increases the level of the supply voltage SVDD (for example 1.2V) to a predetermined level (for example 1.4V) in response to the global feedback signal GFS.

According to an embodiment of the present invention, when the level of the supply voltage SVDD increases almost to 1.8V, the plurality of the local HPMs 111 to 11n, respectively, receives the target signal having the target frequency f-tar of 200 MHz and the supply voltage SVDD of 1.8V level output from the supply voltage generator 30, and outputs the local feedback signal indicating one of increasing, maintaining, and decreaseing the level of the supply voltage SVDD.

For example, when each of the local HPM 111 and 112 outputs the local feedback signal LFS1 and LFS2 indicating an increase in the level of the supply voltage SVDD, when each of the local HPM 113 and 114 outputs the local feedback signal LFS3 and LFS4 indicating a maintenance of the level of the supply voltage SVDD, and when each of the local HPM 115 and 11n outputs the local feedback signal LFS5 and LFSn indicating a decrease of the level of the supply voltage SVDD, the global HPM 40 may output the global feedback signal GFS indicating a maintenance of the level of the supply voltage SVDD to the supply voltage generator 30 in response to the target signal having the target frequency f-tar of 200 MHz, the level (for example 1.8V) of the supply voltage SVDD output from the supply voltage generator 30, and each of the local feedback signals LFS1 to LFSn.

In this case, the supply voltage generator 30 outputs the supply voltage SVDD having a level of 1.8V to the plurality of the local HPMs 111 to 11n, respectively. That is, the apparatus 10 for controlling the supply voltage keeps controlling the level of the supply voltage SVDD to get the target signal having the target frequency f-tar of 200 MHz.

Figure 2:
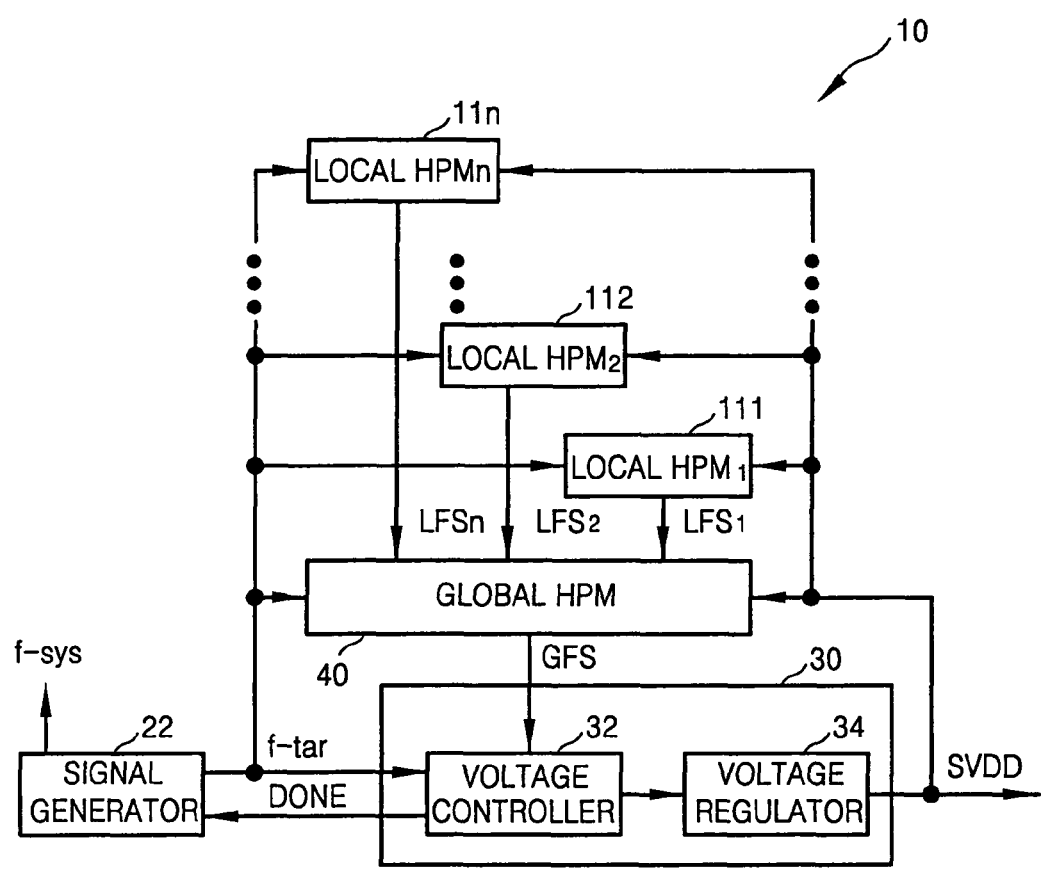
FIG. 2 is a block diagram of an apparatus for controlling a supply voltage using hierarchical performance monitors according to an embodiment of the present invention.

FIG. 2 is a block diagram of an apparatus for controlling supply voltage comprising hierarchical performance monitors according to an embodiment of the present invention, and FIG. 3 is an example of a method for arranging the hierarchical performance monitors illustrated in FIG. 2.

Referring to FIGS. 2 and 3, the apparatus 10 for controlling the supply voltage includes a signal generator 22, a supply voltage generator 30, a global HPM 40, and a plurality of the local HPMs 111 to 11n.

The signal generator 22 generates a first signal having a first frequency f-sys and a second signal having a second frequency f-tar. Initially, although not shown in FIG. 2, the first signal having the first frequency f-sys is supplied to the global HPM 40, to each of the local HPMs 111 to 11n, and to predetermined apparatuses (not shown) implemented in each of the domains 101 to 106. The second frequency f-tar is used as a target operating frequency.

The supply voltage generator 30 generates a supply voltage SVDD having a controllable level. The supply voltage SVDD is supplied to the global HPM 40, to each of the local HPMs 111 to 11n, and to the predetermined apparatus (not shown) implemented in each of the domains 101 to 106.

The plurality of the local HPMs 111 to 11n, respectively, receive the second signal having the second frequency f-tar and the supply voltage SVDD output from the supply voltage generator 30, monitor whether the level of the supply voltage SVDD corresponds to the second frequency f-tar based on the functional relationship between the second frequency f-tar and the supply voltage SVDD, and generate local feedback signals LFS1 to LFSn according to the monitoring result.

The global HPM 40 receives the second signal having the second frequency f-tar, the level of the supply voltage SVDD output from the supply voltage generator 30, and the local feedback signals LFS1 to LFSn output from the plurality of the local monitors 111 to 11n, monitors continuously whether the level of the supply voltage SVDD corresponds to the second frequency f-tar based on those signals received, generates a global feedback signal GFS according to the monitoring result.

The supply voltage generator 30 controls the level of the supply voltage SVDD based on the second signal having the second frequency f-tar and the global feedback signal GFS, and generates an indicating signal DONE based on the controlled level of the voltage supply SVDD.

For example, the supply voltage generator 30 may generate an activated indicating signal DONE when the level of the supply voltage SVDD corresponds to the second frequency f-tar, or the supply voltage generator 30 may generate an inactivated indicating signal DONE when the level of the supply voltage SVDD is not corresponding to the second frequency f-tar.

The signal generator 22 generates the first signal having one of the first frequency f-sys and the second frequency f-tar based on the indicating signal DONE output from the supply voltage generator 30.

For example, the signal generator 22 generates the first signal having the first frequency f-sys in response to the inactivated indicating signal DONE, or generates the first signal having the second frequency in response to the activated indicating signal DONE.

Referring to FIGS. 2 and 3, the apparatus for controlling the supply voltage according to an embodiment of the present invention may be explained in detail as follows. In this explanation it is supposed that the appropriate level of the supply voltage SVDD is 1.0V when the second frequency f-tar is 100 MHz, and the appropriate level of the supply voltage SVDD is 1.8V when the second frequency f-tar is 200 MHz based on the functional relationship between the second frequency f-tar and the supply voltage SVDD.

In other words, when the first and the second signal have a same frequency such as 100 MHz, the supply voltage generator 30 may supply the supply voltage SVDD having 1.0V level to the global HPM 40 and to the plurality of local HPMs 111 to 11n, respectively.

However, the second frequency f-tar increases from 100 MHz to 200 MHz, the level of the supply voltage SVDD (e.g. 1.0V) supplied to the global HPM 40 and to the plurality of the local HPMs 111 to 11n, respectively, is not suitable for the second frequency 200 MHz. Therefore, the level of the supply voltage SVDD (e.g. 1.0V) output from the supply voltage generator 30 should be increased to be suitable for the second frequency 200 MHz.

As explained with reference to FIGS. 1 and 3, when the level of the supply voltage is increased to almost 1.8V, the global HPM 40 and the plurality of the local HPMs 111 to 11n, respectively, receive the second signal having the second frequency f-tar of 200 MHz and the supply voltage SVDD of 1.8V output from the supply voltage generator 30, and outputs the local feedback signal indicating an increase, a maintenance, or a decrease of the level of the supply voltage SVDD.

In this case, the supply voltage generator 30 outputs the supply voltage SVDD of 1.8V level to the global HPM 40 and to the plurality of the local HPMs 111 to 11n, respectively, and outputs the activated indicating signal DONE to the signal generator 20. Therefore, the signal generator 20 outputs the first signal having the second frequency of 200 MHz in response to the activated indicating signal DONE. That is, the apparatus 10 for controlling the supply voltage continuously controls the level of the supply voltage SVDD in order to obtain the first signal having the second frequency of 200 MHz.

Figure 4:
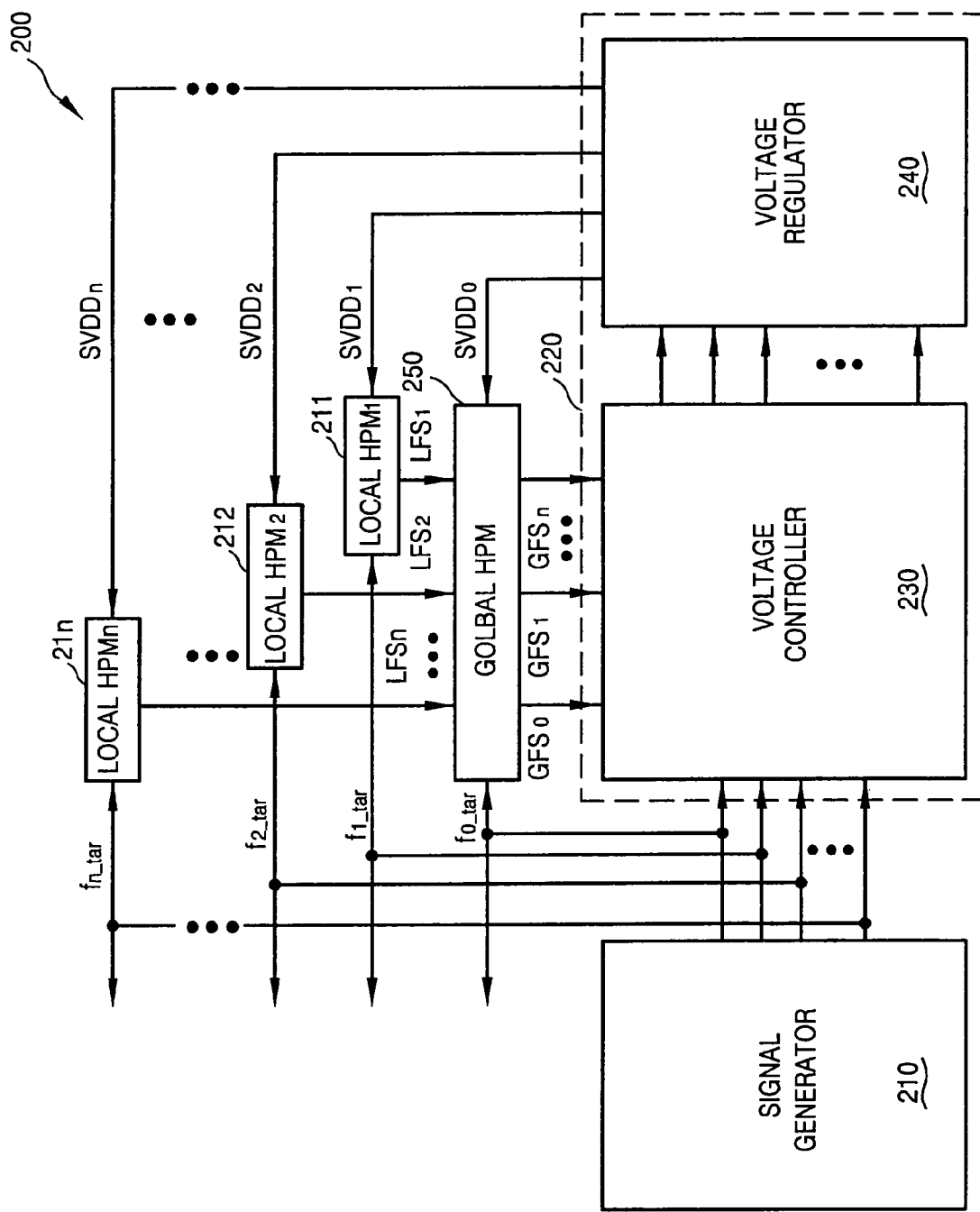
FIG. 4 is a block diagram of an apparatus for controlling a supply voltage using hierarchical performance monitors according to an embodiment of the present invention.

FIG. 4 is a block diagram of an apparatus for controlling a supply voltage comprising hierarchical performance monitors according to an embodiment of the present invention. Referring to FIG. 4, an apparatus 200 for controlling a supply voltage includes a signal generator 210, a plurality of local HPMs 211 to 21n, a supply voltage generator 220, and a global HPM 250.

The signal generator 210 generates a plurality of target signals respectively having different target frequencies f0-tar, f1-tar, f2-tar, . . . fn-tar.

The plurality of local HPMs 211 to 21n may be implemented in each different semiconductor apparatus and/or may be implemented in a different domain within an SOC.

A first local HPM1 211 receives a target signal having the first target frequency f1-tar and a first supply voltage SVDD1, monitors whether the level of the first supply voltage SVDD1 corresponds to the first target frequency f1-tar based on a predetermined functional relationship between the first target frequency f1-tar and the first supply voltage SVDD1, and generates a first local feedback signal LFS1 according to the monitoring result.

A second local HPM2 212 receives a target signal having the second target frequency f2-tar and a second supply voltage SVDD2, monitors whether the level of the second supply voltage SVDD2 corresponds to the second target frequency f2-tar based on a predetermined functional relationship between the second target frequency f2-tar and the second supply voltage SVDDs, and generates a second local feedback signal LFS2 according to the monitoring result.

An $n^{th}$ local HPMn 21n receives a target signal having the $n^{th}$ target frequency fn-tar and an $n^{th}$ supply voltage SVDDn, monitors whether the level of the $n^{th}$ supply voltage SVDDn corresponds to the $n^{th}$ target frequency fn-tar based on a predetermined functional relation between the $n^{th}$ target frequency fn-tar and the nth supply voltage SVDDn, and generates a $n^{th}$ local feedback signal LFSn according to the monitoring result.

The global HPM 250 receives a target signal having the $(n+1)^{th}$ target frequency f0-tar, a $(n+1)^{th}$ supply voltage SVDD0, and the local feedback signals LFS1 to LFSn output from the plurality of the local HPMs 211 to 21n, respectively, monitors whether the level of the $(n+1)^{th}$ supply voltage SVDD0 corresponds to the $(n+1)^{th}$ target frequency f0-tar based on a predetermined functional relationship between the $(n+1)^{th}$ target frequency f0-tar and the $(n+1)^{th}$ supply voltage SVDD0, and generates a plurality of global feedback signals GFS0 to GFSn according to the monitoring result.

The supply voltage generator 220 receives a plurality of target signals having a different target frequency f0-tar to fn-tar output from the signal generator 210 and the plurality of the global feedback signals GFS0 to GFSn output from the global HPM 250, controls the each level of the supply voltage SVDD0 to SVDDn based on those received signals, and outputs each supply voltage SVDD0 to SVDDn having a controlled level.

The supply voltage generator 220 includes a voltage controller 230 and a voltage regulator 240. The voltage controller 230 receives the plurality of target signals having a different target frequency f0-tar to fn-tar and the plurality of global feedback signals GFS0 to GFSn, controls each level of the supply voltage SVDD0 to SVDDn based on the received signals, and outputs each supply voltage SVDD0 to SVDDn having a controlled level.

The voltage regulator 240 generates each of the supply voltages SVDD0 to SVDDn regulated based on each level of the supply voltage SVDD0 to SVDDn output from the voltage controller 230.

Figure 5:
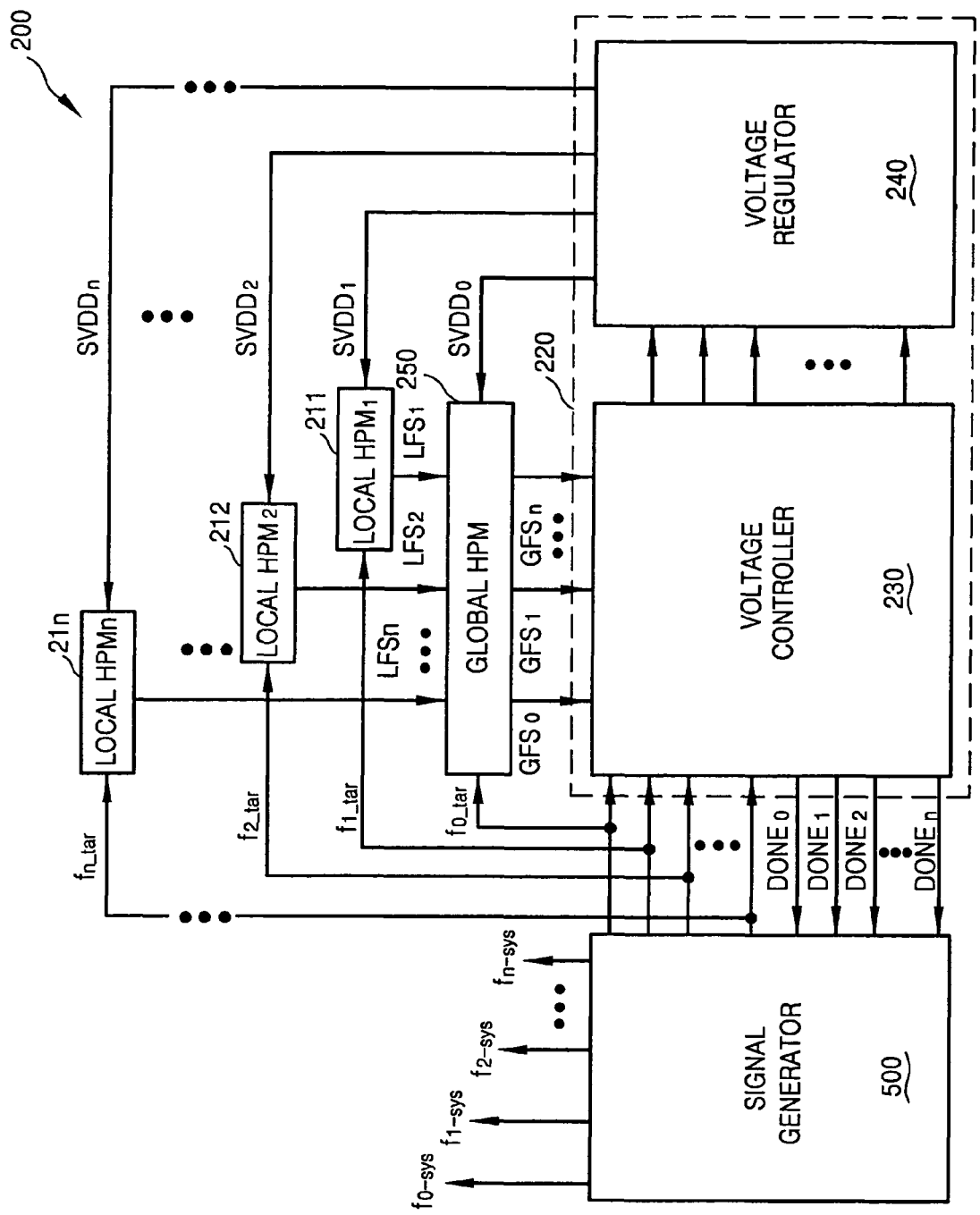
FIG. 5 is a block diagram of an apparatus for controlling a supply voltage using hierarchical performance monitors according to an embodiment of the present invention.

FIG. 5 is a block diagram of an apparatus for controlling a supply voltage comprising hierarchical performance monitors according to an embodiment of the present invention. Referring to FIG. 5, the apparatus 200 for controlling the supply voltage includes a signal generator 500, a plurality of local HPMs 211 to 21n, a supply voltage generator 220, and a global HPM 250.

The signal generator 500 generates a plurality of system signals each having a different system frequency f0-sys to fn-sys and a plurality of target signals each having a different target frequency f0-tar to fn-tar.

The plurality of system signals each having a different system frequency f0-tar to fn-tar may be supplied to each corresponding apparatus or system. The plurality of local HPMs 211 to 21n may be, respectively, implemented in each different semicondcutor apparatus or each different domain within a SOC.

The first local HPM receives a target signal having a first target frequency f1-tar and a first supply voltage SVDD1, monitors whether a level of the first supply voltage SVDD1 corresponds to the first target frequency f1-tar based on a predetermined functional relationship between the first target frequency f1-tar and the first supply voltage SVDD1, and generates a first local feedback signal LFS1 according to the monitoring result.

The second local HPM receives a target signal having a second target frequency f2-tar and a second supply voltage SVDD2, monitors whether a level of the second supply voltage SVDD2 corresponds to the second target frequency f2-tar based on a predetermined functional relationship between the second target frequency f2-tar and the second supply voltage SVDD2, and generates a second local feedback signal LFS2 according to the monitoring result.

The $n^{th}$ local HPMn 21n receives a target signal having a $n^{th}$ target frequency fn-tar and a $n^{th}$ supply voltage SVDDn, monitors whether a level of the $n^{th}$ supply voltage SVDDn corresponds to the $n^{th}$ target frequency fn-tar based on a predetermined functional relationship between the $n^{th}$ target frequency fn-tar and the $n^{th}$ supply voltage SVDDn, and generates the $n^{th}$ local feedback signal LFSn according to the monitoring.

The global HPM 250 receives a target signal having a $(n+1)^{th}$ target frequency f0-tar, a $(n+1)^{th}$ supply voltage SVDD0, and the local feedback signals LFS1 to LFSn, respectively, output from the plurality of the local HPMs 211 to 21n, monitors whether a level of the $(n+1)^{th}$ supply voltage SVDD0 corresponds to the $(n+1)^{th}$ target frequency f0-tar based on a predetermined functional relationship between the $(n+1)^{th}$ target frequency f0-tar and the $(n+1)^{th}$ supply voltage SVDD0, and generates a plurality of global feedback signals GFS0 to GFSn according to the monitoring result.

The supply voltage generator 220 receives the plurality of target signals each having a different target frequency f0-tar to fn-tar output from the signal generator and the plurality of global feedback signals GFS0 to GFSn output from the global HPM 250, controls the level of each supply voltage SVDD0 to SVDDn based on those received signals, and outputs each of the supply voltages SVDD0 to SVDDn having a controlled level.

The supply voltage generator 220 generates the first indicating signal DONE1 based on the first supply voltage SVDD1 having a controlled level, the second indicating signal DONE2 based on the second supply voltage SVDD2 having a controlled level, the $n^{th}$ indicating signal DONEn based on the $n^{th}$ supply voltage SVDDn having a controlled level, and the $(n+1)^{th}$ indicating signal based on the $(n+1)^{th}$ supply voltage SVDD0 having a controlled level.

For example, the supply voltage generator 220 generates each of the activated indicating signals DONE0 to DONEn when the controlled level of the supply voltage SVDD0 to SVDDn, respectively, corresponds to each target frequency f0-tar to fn-tar, otherwise the supply voltage generator 220 generates each of the inactivated indicating signal DONE0 to DONEn.

In other words, the supply voltage generator 220 generates the activated first indicating signal DONE1 when the controlled level of the first supply voltage SVDD1 corresponds to the first target frequency f1-tar, or the supply voltage generator 220 generates the first inactivated indicating signal DONE1. Also, the supply voltage generator 220 generates the activated $n^{th}$ indicating signal DONEn when the controlled level of the $n^{th}$ supply voltage SVDDn corresponds to the $n^{th}$ target frequency fn-tar, or the supply voltage generator 220 generates the inactivated $n^{th}$ indicating signal DONEn.

The supply voltage generator 220 includes the voltage controller 230 and the voltage regulator 240. The voltage controller 230 receives the plurality of target signals having different target frequencies f0-tar to fn-tar output from the signal generator 210 and the plurality of the global feedback signals GFS0 to GFSn output from the global HPM 250, controls the level of each supply voltage SVDD0 to SVDDn based on those received signals, and outputs each supply voltage SVDD0 to SVDDn having a controlled level.

The voltage regulator 240 generates each supply voltage SVDD to SVDDn regulated based on the level of each supply voltage SVDD0 to SVDDn output from the voltage controller 230.

Here, the signal generator 500 generates the first system signal having the first system frequency f1-sys or the first system signal having the first target frequency f1-tar in response to the first indicating signal DONE1. For example, the signal generator 500 generates the first system signal having the first target frequency f1-tar in response to the first activated indicating signal DONE1, and the signal generator 500 generates the first system signal having the first system frequency f1-sys in response to the first inactivated indicating signal DONE1.

Also, the signal generator 500 generates the $(n+1)^{th}$ system signal having the $(n+_1)^{th}$ system frequency f0-sys or the $(n+1)^{th}$ system signal having the $(n+1)^{th}$ target frequency f0-tar in response to the $(n+1)^{th}$ indicating signal DONE0.

The supply voltage generator 220 generates each of the activated indicating signal DONE0 to DONEn when the level of each supply voltage SVDD0 to SVDDn, respectively, corresponds to each target frequency f0-tar to fn-tar. Therefore, the signal generator 500 changes each system frequency f0-sys to fn-sys into each target frequency f0-tar to fn-tar in response to each activated indicating signal DONE0 to DONEn.

FIG. 6 is an arrangement plan for explaining a method for arranging the hierarchical performance monitors according to an embodiment of the present invention. As illustrated in FIGS. 1 to 5, each local HPM from 311 to 31n, from 321 to 32l, from 331 to 33k, the global HPM from 341 to 34m of a first stage, and the global HPM 351 of a second stage are hierarchically arranged.

The hierarchical performance monitors are illustrated to be implemented in a total of three stages for a convenient explanation in this detailed statement, but the apparatus and method for controlling the supply voltage embodiments of the present invention is not restricted thereto and the hierarchical performance monitors may be implemented in n stages, where 'n' is a natural number.

Each of the local HPMs from 311 to 31n, from 321 to 32l, from 331 to 33k implemented in each different domain monitors continuously whether the level of the input supply voltage corresponds to the target frequency of the input target signal based on the functional relationship between the input supply voltage and the target frequency of the input target signal, and outputs the corresponding local feedback signal according to the monitoring result.

The global HPMs from 341 to 34m implemented in each different domain, respectively, receives the input supply voltage, the target frequency of the input target signal, and the local feedback signal output from at least one of the local HPMs from 311 to 31n, from 321 to 32l, from 331 to 33k, monitors whether the level of the input supply voltage corresponds to the target frequency of the input target signal, and generates the first global feedback signal corresponding to the monitoring result.

For example, the first global HPM 341 of the first stage receives the input supply voltage, the target frequency of the input target signal, and the local feedback signals output from the plurality of local HPMs from 311 to 31n, respectively, and generates a first global first feedback signal based on the received signals.

The second global HPM 342 of the first stage receives the input supply voltage, the target frequency of the input target signal, and the local feedback signals output from the plurality of local HPMs from 321 to 32l respectively, and generates a first global second feedback signal based on the received signals.

The global HPM 351 of the second stage generates at least one of the second global feedback signals based on the input supply voltage, the target frequency of the input target signal, and the first global first feedback signals output from the global HPMs from 341 to 34m of the first stage, respectively.

According to exemplary embodiments of the present invention, an apparatus for controlling a supply voltage comprising hierarchical performance monitors exactly controls the level of the supply voltage, which is supplied or will be supplied to the semiconductor apparatus or the system, to be suitable for the target operating frequency and to minimize the power consumption or the energy consumption of the semiconductor apparatus or the system, regardless of the inequal features of the semiconductor apparatus or the system interior.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for controlling a supply voltage using hierarchical performance monitors comprising:
   a supply voltage generator generating a supply voltage having a controllable level;
   a signal generator generating a first signal having a first frequency and a second signal having a second frequency;
   a plurality of local performance monitors, each of the plurality of local performance monitors receiving the second signal having the second frequency and the supply voltage output from the supply voltage generator, monitoring whether a level of the received supply voltage corresponds to the received second frequency based on a predetermined functional relationship between the received second frequency and the received supply voltage, and generating a local feedback signal according to a result of the monitoring; and
   a global performance monitor receiving the second signal having the second frequency, the supply voltage output from the supply voltage generator, and the local feedback signals output from the plurality of the local performance monitors, respectively, monitoring whether the received supply voltage corresponds to the received second frequency based on the received signals, and generating a global feedback signal according to a result of the monitoring,
   wherein the supply voltage generator controls a level of the supply voltage based on the second signal having the second frequency and the global feedback signal, and generates an indicating signal based on a controlled level of the supply voltage, and
   wherein the signal generator generates the first signal having one of the first frequency and the second frequency based on the indicating signal output from the supply voltage generator.

2. The apparatus as claimed in claim 1, wherein each of the plurality of local monitors is implemented in each different domain within the apparatus for controlling the supply voltage using the hierarchical performance monitors.

3. The apparatus as claimed in claim 1, wherein the apparatus is implemented as a system on chip SOC.

4. The apparatus as claimed in claim 1, wherein the predetermined functional relationship is that the level of the supply voltage increases when the second frequency increases.

5. The apparatus as claimed in claim 1, wherein the predetermined functional relationship is that the level of the supply voltage decreases when the second frequency increases.

6. An apparatus for controlling a supply voltage using hierarchical performance monitors comprising:

a supply voltage generator generating a plurality of supply voltages having different voltage levels, respectively;

a signal generator generating a plurality of target signals having different target frequencies, respectively;

a plurality of local performance monitors; and a global performance monitor, wherein each of the plurality of local performance monitors receives a corresponding target signal from among the plurality of target signals, a corresponding supply voltage from among the plurality of supply voltages, monitors whether a level of the received supply voltage corresponds to the target frequency of the received target signal based on a predetermined functional relationship between the target frequency of the received target signal and the received supply voltage, and outputs a local feedback signal according to a result of the monitoring, wherein the global performance monitor receives the corresponding target signal from among the plurality of the target signals, the corresponding supply voltage from among the plurality of supply voltages, and the local feedback signals output from among the plurality of local performance monitors, monitors whether levels of the supply voltages of the plurality of local performance monitors, respectively, and the level of the supply voltage supplied to the global performance monitor corresponds to the target frequencies of the target signals supplied to the plurality of local performance monitors, respectively, and the target frequency of the target signal supplied to the global performance monitor based on the received signals, and generates a plurality of global feedback signals according to a result of the monitoring, and wherein the supply voltage generator receives the plurality of target signals and the plurality of global feedback signals output from the global performance monitor, controls each level of the plurality of supply voltages based on the received signals, and outputs the plurality of level-controlled supply voltages, respectively.

7. An apparatus for controlling a supply voltage using hierarchical performance monitors comprising:

a supply voltage generator generating a plurality of supply voltages having different voltage levels, respectively, a signal generator generating a plurality of system signals having different system frequencies and a plurality of target signals having different target frequencies, respectively;

a plurality of local performance monitors; and a global performance monitor, wherein each of the plurality of local performance monitors receives a corresponding target signal from among the plurality of target signals and a corresponding supply voltage from among the plurality of supply voltages, monitors whether a level of the received supply voltage corresponds to the target frequency of the received target signal based on a predetermined functional relationship between the frequency of the received target signal and the received supply voltage, and outputs a local feedback signal according to a result of the monitoring, wherein the global performance monitor receives a corresponding target signal from among the plurality of target signals, a corresponding supply voltage from among the plurality of supply voltages, and the local feedback signals output from among the plurality of local performance monitors, monitors whether levels of the supply voltages of the plurality of local performance monitors, respectively, and the level of the supply voltage supplied to the global performance monitor corresponds to the target frequencies of the target signals supplied to the plurality of local performance monitors, respectively, and the target frequency of the target signal supplied to the global performance monitor based on the received signals, and generates a plurality of global feedback signals according to a result of the monitoring, wherein the supply voltage generator receives the plurality of target signals and the plurality of global feedback signals output from the global performance monitor, controls each level of the plurality of supply voltages based on the received signals, generates a corresponding indicating signal based on the plurality of level-controlled supply voltages, respectively, and wherein the signal generator changes a system frequency of at least one system signal among a plurality of system signals to a target frequency of at least one target signal among the plurality of target signals based on each of the plurality of indicating signals output from the supply voltage generator.

8. A system having a plurality of semiconductor apparatuses including respectively a corresponding local performance monitor, the system comprising:

a supply voltage generator generating a plurality of supply voltages having different voltage levels, respectively;

a signal generator generating a plurality of target signals having different target frequencies, respectively; and a global performance monitor, wherein each local performance monitor implemented in the plurality of semiconductor apparatuses receives a corresponding target signal from among the plurality of target signals and a corresponding supply voltage from among the plurality of supply voltages, monitors whether a level of the received supply voltage corresponds to the target frequency of the received target signal based on a predetermined functional relationship between the target frequency of the received target signal and the received supply voltage, and outputs a local feedback signal according to a result of the monitoring, wherein the global performance monitor receives a corresponding target signal from among the plurality of target signals, a corresponding supply voltage from among the plurality of supply voltages, and the local feedback signals output from the plurality of local performance monitors implemented in the plurality of semiconductor apparatuses, respectively, monitors whether levels of the supply voltages supplied to the plurality of semiconductor apparatuses, respectively, and the level of the supply voltage supplied to the global performance monitor corresponds to the target frequencies supplied to the plurality of semiconductor apparatuses, respectively, and target frequency of the target signal supplied to the global performance monitor based on the received signals, and generates a plurality of global feedback signals according to a result of the monitoring, and wherein the supply voltage generator receives the plurality of target signals and the plurality of global feedback signals output from the global performance monitor, controls each level of the supply voltages supplied to the plurality of semiconductor apparatuses, respectively, based on the received signals, and outputs the plurality of level-controlled supply voltages respectively.

9. A system having a plurality of semiconductor apparatuses including a plurality of corresponding local performance monitors, respectively, comprising:

a supply voltage generator generating a plurality of supply voltages having different voltage levels, respectively;

a signal generator generating a plurality of system signals having different system frequencies and a plurality of target signals having different target frequencies, respectively; and a global performance monitor, wherein the corresponding local performance monitor receives a corresponding target signal from among the plurality of target signals and a corresponding supply voltage from among the plurality of supply voltages, monitors whether a level of the received supply voltage corresponds to the target frequency of the received target signal based on a predetermined functional relationship between the target frequency of the received target signal and the received supply voltage, and outputs a local feedback signal according to a result of the monitoring, wherein the global performance monitor receives a corresponding target signal from among the plurality of target signals, a corresponding supply voltage from among the plurality of supply voltages, and local feedback signals output from the local performance monitors implemented in each of the plurality of semiconductor apparatuses, respectively, monitors whether levels supplied to the plurality of semiconductor apparatuses, respectively, and the level of the supply voltage supplied to the global performance monitor corresponds to target frequencies supplied to the semiconductor apparatuses and the target frequency supplied to the global performance monitor based on the received signals, and generates a plurality of the global feedback signals according to a result of the monitoring, wherein the supply voltage generator receives the plurality of target signals and the plurality of global feedback signals output from the global performance monitor, controls levels of the plurality of the supply voltages supplied to the plurality of semiconductor apparatuses, respectively, based on the received signals, and outputs a corresponding indicating signal based on the plurality of the level-controlled supply voltages, respectively, and wherein the signal generator changes a system frequency of at least one system signal from among the plurality of system signals to a target frequency of at least one target signal from among the plurality of target signals based on each of the plurality of indicating signals output from the supply voltage generator.

10. A method for controlling a supply voltage using hierarchical performance monitors comprising:

generating a supply voltage having an adjustable level;

generating a first signal having a first frequency and a second signal having a second frequency;

each of a plurality of local performance monitors receiving the second signal having the second frequency and the supply voltage, monitoring whether a level of the supply voltage corresponds to the second frequency based on a predetermined functional relationship between the second frequency and the supply voltage, and generating a local feedback signal according to a result of the monitoring;

a global performance monitor receiving the second signal having the second frequency, the supply voltage, and the local feedback signals output from the plurality of the local performance monitors, respectively, monitoring whether a level of the supply voltage corresponds to the second frequency based on the received signals, and generating a global feedback signal according to a result of the monitoring;

adjusting the level of the supply voltage based on the second signal having the second frequency and the global feedback signal, and generating an indicating signal based on the adjusted level of the supply voltage; and generating the first signal having the first or the second frequency based on the indicating signal.

11. An apparatus for controlling a supply voltage using hierarchical performance monitors comprising:

a supply voltage generator generating a plurality of supply voltages each having a different voltage level, respectively;

a signal generator generating a plurality of target signals having a different target frequency, respectively;

each of a plurality of local performance monitors receiving a corresponding target signal from among the plurality of target signals and a corresponding supply voltage from among the plurality of supply voltages, monitoring whether a level of the received supply voltage corresponds to the target frequency of the received target signal based on a predetermined functional relationship between the target frequency of the received target signal and the received supply voltage, and outputting a local feedback signal according to a result of the monitoring; and a global performance monitor receiving a corresponding target signal from among the plurality of target signals, a corresponding supply voltage from among the plurality of supply voltages, and the local feedback signals output from the plurality of local performance monitors, respectively, monitoring whether each level of the supply voltages supplied to the plurality of local performance monitors and the level of the supply voltage supplied to the global performance monitor correspond to each of the target frequencies of the target signals supplied to the plurality of local performance monitors and the target frequency of the target signal supplied to the global performance monitor based on the received signals, and generating a plurality of global feedback signals according to a result of the monitoring, wherein the supply voltage generator receives the plurality of target signals and the plurality of global feedback signals output from the global performance monitor, adjusts each level of the plurality of the supply voltages based on the received signals, and outputs the plurality of supply voltages the level-adjusted, respectively.

12. An apparatus for controlling a supply voltage using hierarchical performance monitors comprising:

a supply voltage generator generating a plurality of the supply voltages each having a different voltage level;

a signal generator generating a plurality of system signals each having a different system frequency and a plurality of target signals each having a different target frequency;

each of plurality of local performance monitors receiving a corresponding target signal from among the plurality of the target signals and a corresponding supply voltage from among the plurality of supply voltages, monitoring whether a level of the received supply voltage corresponds to the target frequency of the received target signal based on a predetermined functional relationship between the frequency of the received target signal and the received supply voltage, and outputs a local feedback signal according to a result of the monitoring;

a global performance monitor receiving a corresponding target signal from among the plurality of target signals, a corresponding supply voltage from among the plurality of supply voltages, and the local feedback signals output from the plurality of local performance monitors, respectively, monitoring whether levels of the plurality of supply voltages supplied to the plurality of the local performance monitors and the level of the supply voltage supplied to the global performance monitor, respectively, correspond to each of the target frequencies of the target signals supplied to the plurality of local performance monitors and the target frequency of the target signal supplied to the global performance monitor based on the received signals, and generating a plurality of global feedback signals according to a result of the monitoring, the supply voltage generator receiving the plurality of target signals and the plurality of global feedback signals output from the global performance monitor, adjusting each level of the plurality of the supply voltages based on the received signals, and outputting a corresponding indicating signal based on each of the plurality of supply voltages which are level-adjusted; and the signal generator changing a system frequency of at least one system signal from among the plurality of system signals into a target frequency of at least one target signal from among the plurality of target signals based on each of the plurality of indicating signals output from the supply voltage generator.

13. A method for controlling a supply voltage using hierarchical performance monitors comprising:

each of a plurality of local performance monitors monitoring whether a level of an input supply voltage corresponds to a target frequency of an input target signal based on a predetermined functional relationship between the input supply voltage and the frequency of the input target signal, and generating a local feedback signal corresponding to a result of the monitoring;

each of a plurality of global performance monitors of a first stage receiving the input supply voltage, the target frequency of the input target signal, and the local feedback signal output from at least one of the plurality of local performance monitors, monitoring whether a level of the input supply voltage corresponds to the target frequency of the input target signal based on the received signals, and generating a first global feedback signal corresponding to a result of the monitoring;

each of a plurality of global performance monitors of a second stage receiving the input supply voltage, the target frequency of the input target signal, and the local feedback signal output from at least one of the plurality of the global performance monitors of the first stage, monitoring whether the level of the input supply voltage corresponds to the target frequency of the input target signal based on the received signals, and generating a second global feedback signal corresponding to a result of the monitoring; and receiving the input supply voltage, the target frequency of the input target signal, and the second global feedback signal output from at least one of the global performance monitors of the second stage, adjusting the level of the supply voltage supplied to each of the plurality of local performance monitors, each of the plurality of the global performance monitors of the first stage, and each of the plurality of the global performance monitors of the second stage based on the received signals, respectively, and outputting the level-adjusted supply voltage.

* * * * *